US012622182B2

(12) United States Patent
Ting et al.

(10) Patent No.: US 12,622,182 B2
(45) Date of Patent: May 5, 2026

(54) SEMICONDUCTOR DEVICE AND METHOD FOR FORMING THE SAME

(71) Applicant: UNITED MICROELECTRONICS CORP., Hsinchu (TW)

(72) Inventors: Yen-Min Ting, Tainan (TW);
Chuan-Fu Wang, Miaoli County (TW);
Yu-Huan Yeh, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 637 days.

(21) Appl. No.: 18/074,548

(22) Filed: Dec. 5, 2022

(65) Prior Publication Data

US 2024/0130254 A1      Apr. 18, 2024

(30) Foreign Application Priority Data

Oct. 18, 2022    (TW) .................................. 111139464

(51) Int. Cl.
*H10N 70/00*        (2023.01)
*H10B 63/00*        (2023.01)
(52) U.S. Cl.
CPC ........... *H10N 70/823* (2023.02); *H10B 63/80* (2023.02); *H10N 70/011* (2023.02); *H10N 70/841* (2023.02)
(58) Field of Classification Search
CPC ........................... H10N 70/823; H10N 70/841
See application file for complete search history.

(56) References Cited

U.S. PATENT DOCUMENTS

| | | | |
|---|---|---|---|
| 9,923,028 B1 | 3/2018 | Hsu et al. | |
| 12,193,344 B2* | 1/2025 | Wei | H10N 70/24 |

FOREIGN PATENT DOCUMENTS

TW          202121710 A      6/2021

OTHER PUBLICATIONS

Office Action issued by Taiwan Intellectual Property Office on Jan. 30, 2026.

* cited by examiner

*Primary Examiner* — Mark V Prenty
(74) *Attorney, Agent, or Firm* — WPAT, PC

(57) ABSTRACT

A semiconductor device and a method for forming the same are provided. The semiconductor device includes a first semiconductor structure and a second semiconductor structure. The first semiconductor structure includes a first electrode, a second electrode on one side of the first electrode, and a resistive switching film between the first electrode and the second electrode. The first electrode, the resistive switching film and the second electrode are arranged along the first direction. The second semiconductor structure includes a first via and a first metal layer on the first via along a second direction and electrically connected to the first via. The first direction is perpendicular to the second direction. An upper surface of the first electrode, an upper surface of the second electrode, an upper surface of the resistive switching film and an upper surface of the first metal layer are coplanar.

15 Claims, 9 Drawing Sheets

SEMICONDUCTOR DEVICE AND METHOD FOR FORMING THE SAME

This application claims the benefit of Taiwan application Serial No. 111139464, filed Oct. 18, 2022, the subject matter of which is incorporated herein by reference.

BACKGROUND

Technical Field

The present disclosure relates to a semiconductor device and a method for manufacturing the same, and more particularly to a semiconductor device including a resistive switching film and a method for manufacturing the same.

Description of the Related Art

Resistance random access memory (RRAM) is the promising candidate for the next generation of non-volatile memory. A resistance random access memory stores data within a resistive switching film. With applying appropriate voltage, the resistive switching film can be switched from a high resistance state to a low resistance state repeatedly to store the digital information. However, there are still several important issues unaddressed in the development of resistance random access memory, among which, how to reduce the critical dimension of resistance random access memory is a big concern.

It is important to provide technology for semiconductor devices including resistive memory devices with reduced critical dimensions.

SUMMARY

The present disclosure relates to a semiconductor device and a method for manufacturing the same.

According to an embodiment of the present disclosure, a semiconductor device is provided. The semiconductor device includes a first semiconductor structure and a second semiconductor structure disposed on one side of the first semiconductor structure along a first direction. The first semiconductor structure includes a first electrode, a second electrode on one side of the first electrode and a resistive switching film between the first electrode and the second electrode. The first electrode, the resistive switching film and the second electrode are arranged along the first direction. The second semiconductor structure includes a first via and a first metal layer. The first metal layer is on the first via along a second direction and electrically connected to the first via. The first direction is perpendicular to the second direction. An upper surface of the first electrode, an upper surface of the resistive switching film, an upper surface of the second electrode, and an upper surface of the first metal layer are coplanar.

According to another embodiment of the present disclosure, a method for manufacturing a semiconductor device is provided. The method includes the steps of providing a substrate, forming a resistive switching film in the substrate, and forming a first electrode and a second electrode on opposite sides of the resistive switching film.

The above and other embodiments of the disclosure will become better understood with regard to the following detailed description of the non-limiting embodiment(s). The following description is made with reference to the accompanying drawings.

DETAILED DESCRIPTION

Figures 1, 2:
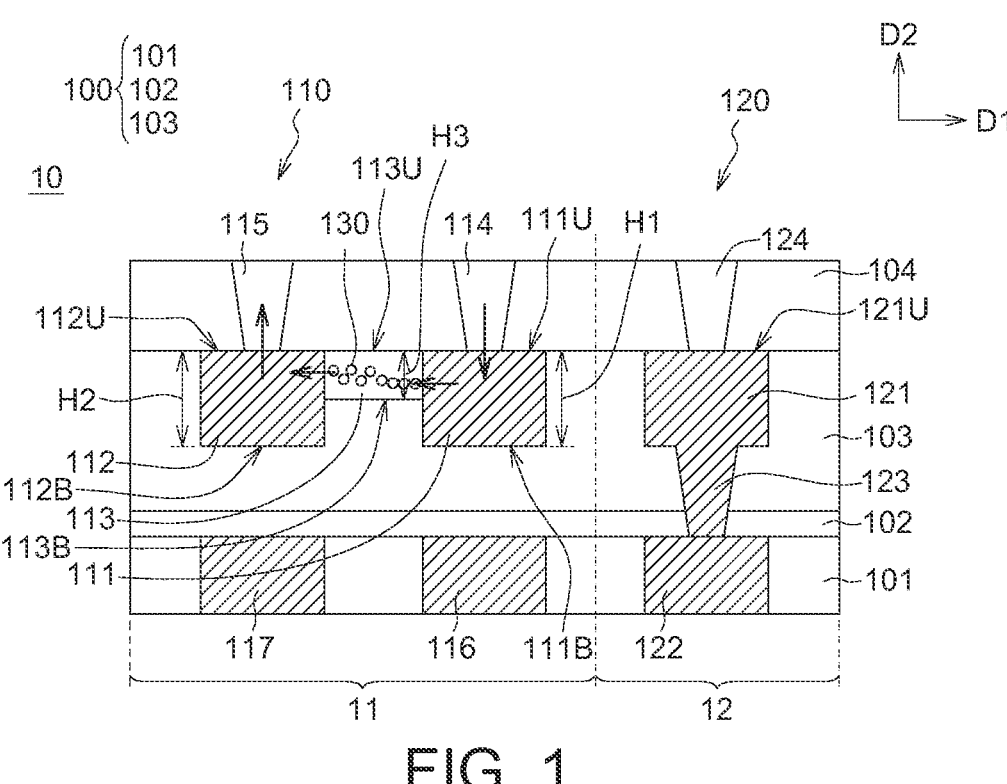
FIG. 1 illustrates a schematic sectional view of a semiconductor device according to an embodiment of the present disclosure.
FIG. 2 illustrates a schematic sectional view of a semiconductor device according to another embodiment of the present disclosure.

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated in another embodiment without further recitation.

Referring to FIG. 1, FIG. 1 illustrates a schematic sectional view of a semiconductor device 10 according to an embodiment of the present disclosure. The semiconductor device 10 includes a substrate 100. The substrate 100 includes a first dielectric layer 101, a second dielectric layer 102 and a third dielectric layer 103 stacked along a second direction D2. A portion of the substrate 100 can be defined as a memory region 11, and another portion of the substrate 100 can be defined as a logic region 12. The memory region 11 and the logic region 12 may be disposed adjacent to each other. The logic region 12 may be disposed around the memory region 11. The semiconductor device 10 includes a first semiconductor structure 110 and a second semiconductor structure 120 in the substrate 100. The first semiconductor structure 110 is located in the memory region 11. The second semiconductor structure 120 is located in the logic region 12. The second semiconductor structure 120 is disposed on one side of the first semiconductor structure 110 along a first direction D1. The first direction D1 is perpendicular to the second direction D2.

The first semiconductor structure 110 includes a first electrode 111, a second electrode 112 and a resistive switching film 113 between the first electrode 111 and the second electrode 112. The second electrode 112 is on one side of the first electrode 111. In this embodiment, the first electrode 111, the resistive switching film 113 and the second electrode 112 are arranged along the first direction D1. The first electrode 111, the resistive switching film 113 and the second electrode 112 are in the third dielectric layer 103. In this embodiment, the resistive switching film 113 directly contacts the first electrode 111 and the second electrode 112.

The second semiconductor structure 120 includes a first metal layer 121, a second metal layer 122 and a first via 123 between the first metal layer 121 and the second metal layer 122. The second metal layer 122 is in the first dielectric layer 101. The first via 123 is in the second dielectric layer 102 and the third dielectric layer 103. The second metal layer 122 is below the first via 123 along the second direction D2. The first metal layer 121 is in the third dielectric layer 103. The first metal layer 121 is on the first via 123 along the second direction D2. The first metal layer 121, the second metal layer 122 and the first via 123 are electrically connected to each other.

A height H1 of the first electrode 111 in the second direction D2 may be equal to a height H2 of the second electrode 112 in the second direction D2.

A height H1 of the first electrode 111 in the second direction D2 may be greater than a height H3 of the resistive switching film 113 in the second direction D2. The present disclosure is not limited thereto. In other embodiments, the height H1 of the first electrode 111 in the second direction D2 may be equal to the height H3 of the resistive switching film 113 in the second direction D2. An upper surface 111U of the first electrode 111, an upper surface 113U of the resistive switching film 113, an upper surface 112U of the second electrode 112, and an upper surface 121U of the first metal layer 121 may be coplanar. A lower surface 111B of the first electrode 111 and a lower surface 112B of the second electrode 112 may be coplanar. In this embodiment, a lower surface 113B of the resistive switching film 113 is higher than the lower surface 111B of the first electrode 111 and/or the lower surface 112B of the second electrode 112. The present disclosure is not limited thereto. In other embodiments, the lower surface 111B of the first electrode 111 and the lower surface 113B of the resistive switching film 113 are coplanar.

In an embodiment, the semiconductor device 10 may include a fourth dielectric layer 104 on the substrate 100. The first semiconductor structure 110 may include a second via 114 and a third via 115 in the fourth dielectric layer 104. The second via 114 is on the upper surface 111U of the first electrode 111. The third via 115 is on the upper surface 112U of the second electrode 112. The second via 114 may be electrically connected to the first electrode 111. The third via 115 may be electrically connected to the second electrode 112. The second semiconductor structure 120 may include a fourth via 124 in the fourth dielectric layer 104. The fourth via 124 is on the first metal layer 121. The fourth via 124 may be electrically connected to the first metal layer 121. The second via 114, the second semiconductor structure 120 and the third via 115 are electrically connected to each other. In an embodiment, the first semiconductor structure 110 of the semiconductor device 10 may include a third metal layer 116 and a fourth metal layer 117 in the first dielectric layer 101 of the substrate 100. The third metal layer 116 may at least partially overlap the first electrode 111 in the second direction D2. The fourth metal layer 117 may at least partially overlap the second electrode 112 in the second direction D2.

The first electrode 111, the second electrode 112 and the resistive switching film 113 can form a resistance random access memory. With applying appropriate voltage to the first electrode 111 and the second electrode 112, a conductive filament 130 can be induced in the resistive switching film 113. The conductive filament 130 penetrates the resistive switching film 113. The opposite ends of the conductive filament 130 can contact the first electrode 111 and the second electrode 112 respectively. The conductive filament 130 can be used as a conductive path between the first electrode 111 and the second electrode 112. In FIG. 1, the current direction is indicated by the arrow, but the present disclosure is not limited to this. The current may flow from the second electrode 112 to the first electrode 111 in other embodiments. When the conductive filament 130 is formed, the resistance random access memory is in a low resistance state. Then, another voltage may be applied to the first electrode 111 and the second electrode 112 to break the conductive filament 130, and the resistance random access memory is switched from a low resistance state to a high resistance state.

Referring to FIG. 2, FIG. 2 illustrates a schematic sectional view of a semiconductor device 20 according to another embodiment of the present disclosure. The difference between the semiconductor device 20 and the semiconductor device 10 is described as follows. The semiconductor device 20 includes a first semiconductor structure 110A in the substrate 100 and in the memory region 11, a second semiconductor structure 120A in the substrate 100 and in the logic region 12. The difference between the first semiconductor structure 110A of FIG. 2 and the first semiconductor structure 110 of FIG. 1 is that the first semiconductor structure 110A further includes a first barrier film 211, a second barrier film 212, a third barrier film 216 and a fourth barrier film 217. The first barrier film 211 is on the outer surface of the first electrode 111. The first barrier film 211 may be between the first electrode 111 and the resistive switching film 113. The first barrier film 211 may be between the first electrode 111 and the third dielectric layer 103. The second barrier film 212 is on the outer surface of the second electrode 112. The second barrier film 212 may be between the second electrode 112 and the resistive switching film 113. The second barrier film 212 may be between the second electrode 112 and the third dielectric layer 103. The third barrier film 216 is on the outer surface of the third metal layer 116. The third barrier film 216 may be between the third metal layer 116 and the first dielectric layer 101. The fourth barrier film 217 is on the outer surface of the fourth metal layer 117. The fourth barrier film 217 may be between the fourth metal layer 117 and the first dielectric layer 101. In the first semiconductor structure 110A, the opposite ends of the conductive filament 130 can contact the first barrier film 211 and the second barrier film 212 respectively. The conductive filament 130 can be used as a conductive path between the first electrode 111 and the second electrode 112.

The difference between the second semiconductor structure 120A of FIG. 2 and the second semiconductor structure 120 of FIG. 1 is that the second semiconductor structure 120A further includes a fifth barrier film 221, a sixth barrier film 222 and a seventh barrier film 223. The fifth barrier film 221 is on the outer surface of the first metal layer 121. The fifth barrier film 221 may be between the first metal layer 121 and the third dielectric layer 103. The sixth barrier film 222 is on the outer surface of the second metal layer 122. The sixth barrier film 222 may be between the second metal layer 122 and the first dielectric layer 101. The seventh barrier film 223 is on the outer surface of the first via 123. The seventh barrier film 223 may be between the first via 123 and the third dielectric layer 103. The seventh barrier film 223 may direct contact the second metal layer 122.

FIGS. 3-9 illustrate a method for manufacturing a semiconductor device according to an embodiment of the present disclosure.

Figure 3:
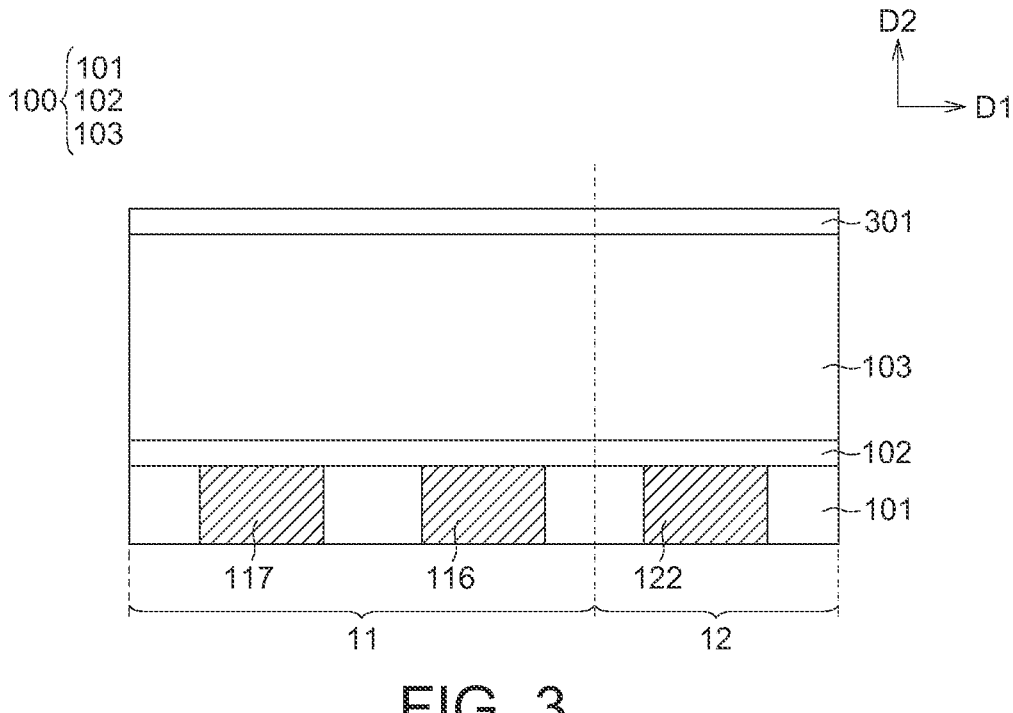
FIGS. 3-9 illustrate a method for manufacturing a semiconductor device according to an embodiment of the present disclosure.

Referring to FIG. 3, a substrate 100 is provided. A second metal layer 122, a third metal layer 116 and a fourth metal layer 117 may be formed in the substrate 100. A mask layer 301 may be formed on the substrate 100. The substrate 100 may include a first dielectric layer 101, a second dielectric layer 102 and a third dielectric layer 103 stacked along a second direction D2. The substrate 100 may be a semiconductor substrate in a certain process stage, such as a semiconductor substrate that a front-end-of-line process (FEOL) and part of a back-end-of-line process (BEOL) have been completed or other semiconductor substrate that a resistance random access memory can be fabricated on the front or back of the substrate. In an embodiment, the second metal layer 122, the third metal layer 116 and the fourth metal layer 117 can be formed in the first dielectric layer 101. Then, the second dielectric layer 102, the third dielectric layer 103 and the mask layer 301 are formed sequentially on the first dielectric layer 101 along the second direction D2 to form the structure shown in FIG. 3. The second metal layer 122, the third metal layer 116 and the fourth metal layer 117 may include the same or different materials. The second metal layer 122, the third metal layer 116 and the fourth metal layer 117 may include conductive materials such as aluminum (Al), copper (Cu), tungsten (W), etc. The present disclosure is not limited thereto. The first dielectric layer 101, the second dielectric layer 102 and the third dielectric layer 103 may include the same or different materials. The first dielectric layer 101, the second dielectric layer 102 and the third dielectric layer 103 may include dielectric materials such as silicon oxide ($SiO_2$), undoped silicate glass (USG), fluorinated silicate glass (FSG), silicon nitride (SiN), silicon oxynitride (SiON), silicon nitricarbide (SiCN), etc. The present disclosure is not limited thereto. The mask layer 301 may include silicon oxide ($SiO_2$), silicon nitride (SiN), titanium nitride (TiN), or other suitable material. A portion of the substrate 100 can be defined as a memory region 11, and another portion of the substrate 100 can be defined as a logic region 12. The third metal layer 116 and the fourth metal layer 117 may be in the memory region 11 of the substrate 100. The second metal layer 122 may be in the logic region 12 of the substrate 100.

Figure 4:
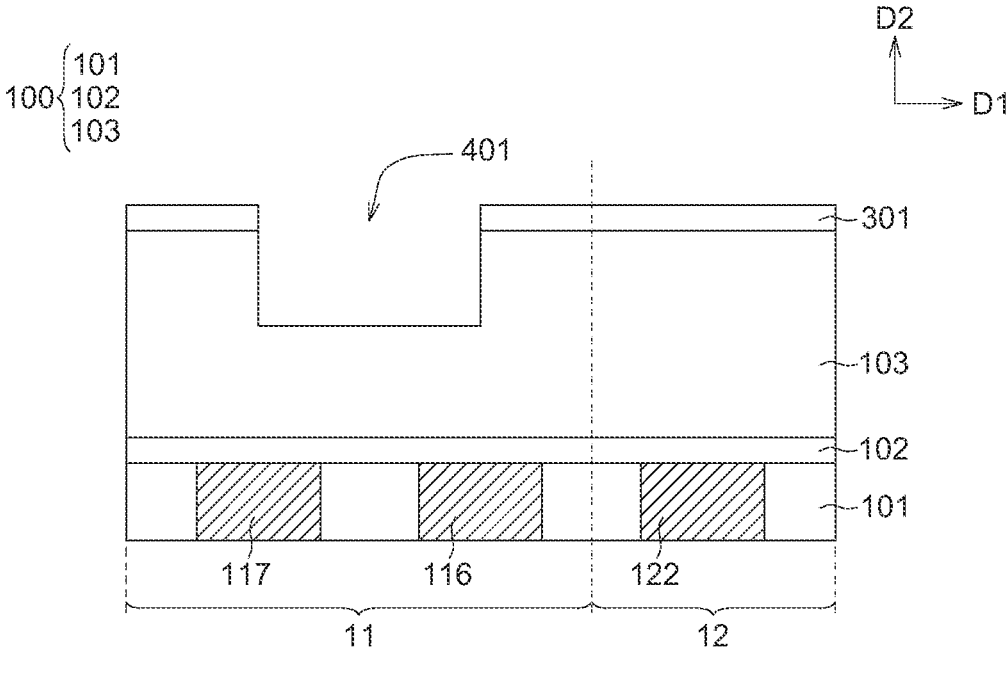

Referring to FIG. 4, an opening 401 is formed in the memory region 11 of the substrate 100. The opening 401 extends along the second direction D2 and penetrates the mask layer 301 and the third dielectric layer 103. The opening 401 exposes a sidewall of the mask layer 301 and a sidewall of the third dielectric layer 103. A bottom of the opening 401 exposes the third dielectric layer 103. In an embodiment, a portion of the mask layer 301 and a portion of the third dielectric layer 103 can be removed by an etching process such as a wet etching process or a dry etching process to form the opening 401.

Figure 5:
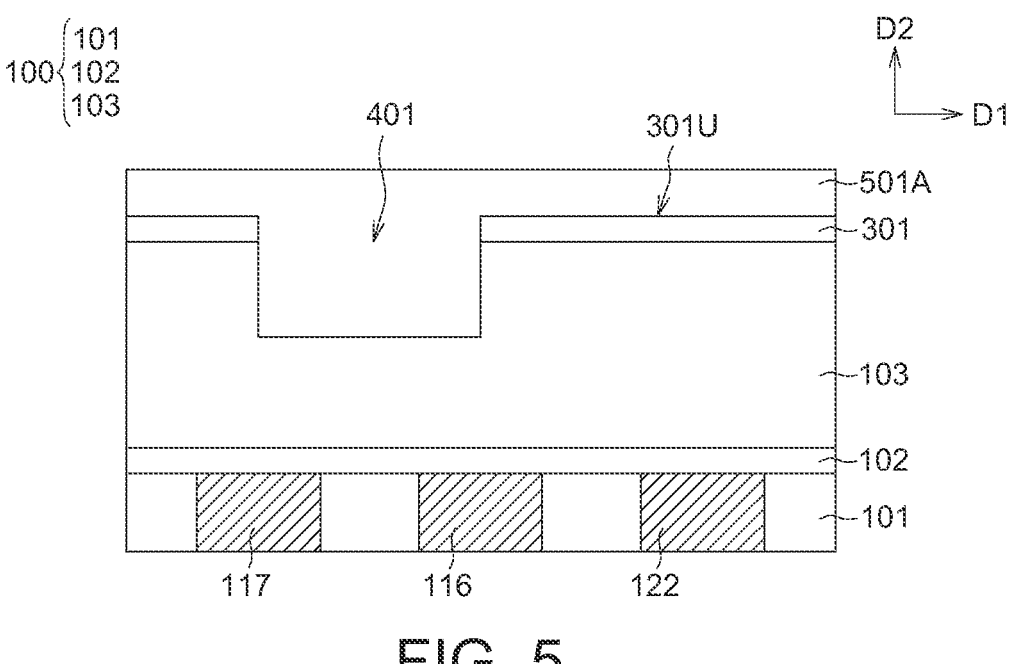

Referring to FIG. 5, a resistive switching material film 501A is formed. In an embodiment, the resistive switching material film 501A can be formed in the opening 401 and on an upper surface 301U of the mask layer 301 by a deposition process such as a chemical vapor deposition (CVD) process. The resistive switching material film 501A may include metal oxide such as hafnium oxide ($HfO_x$), tungsten oxide ($WO_x$), aluminum oxide ($AlO_x$), tantalum oxide ($TaO_x$), nickel oxide ($NiO_x$), titanium oxide ($TiO_x$), zirconium oxide ($ZrO_x$), etc.

Figure 6:
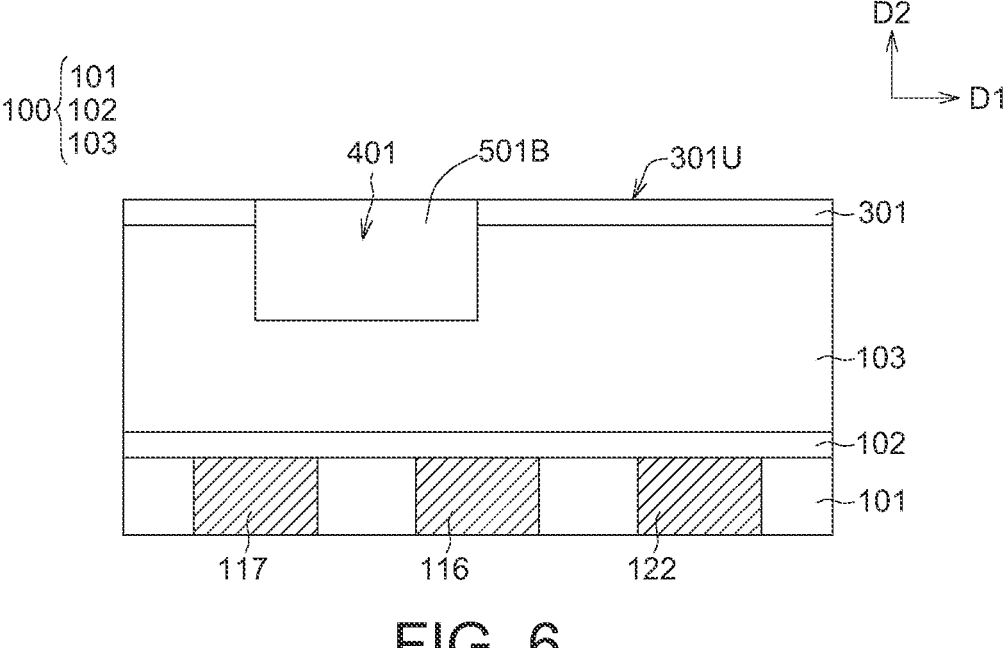

Referring to FIG. 6, a resistive switching material film 501B is formed. In an embodiment, a portion of the resistive switching material film 501A on the upper surface 301U of the mask layer 301 is removed by a chemical-mechanical planarization (CMP) process or other suitable etching process and a portion of the resistive switching material film 501A in the opening 401 is remained. The portion of the resistive switching material film 501A in the opening 401 can be defined as the resistive switching material film 501B.

Figures 7, 8:
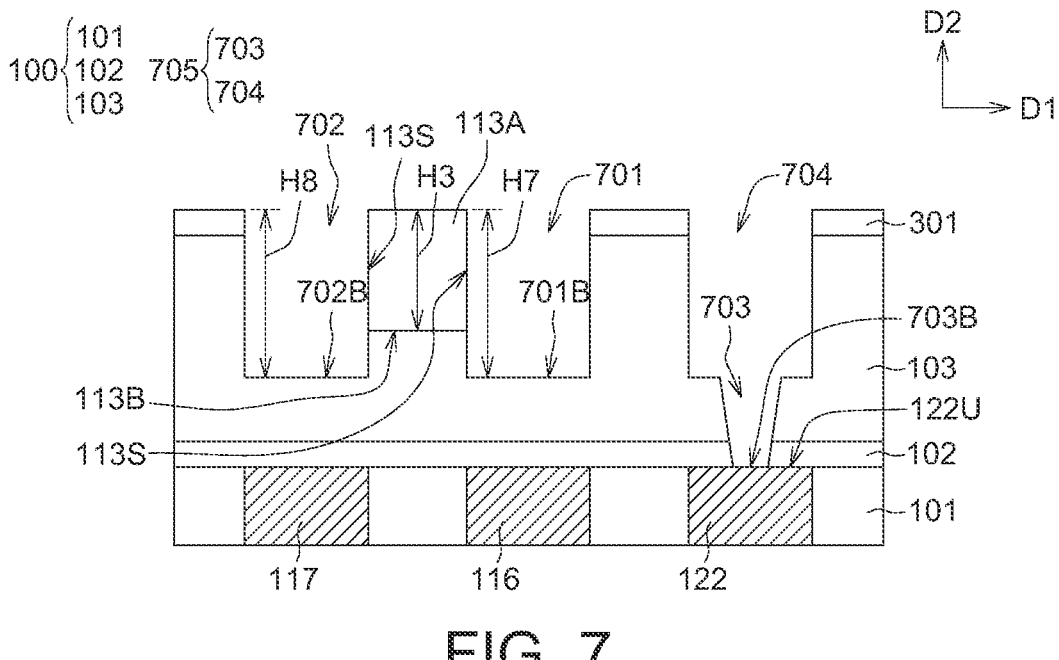

Referring to FIG. 7, a resistive switching film 113A, a first hole 701, a second hole 702 and a third hole 705 are formed. The third hole 705 and the second hole 702 are on opposite sides of the first hole 701. The first hole 701 and the second hole 702 are on opposite sides of the resistive switching film 113A. The first hole 701 extends along the second direction D2 and penetrates the mask layer 301 and the third dielectric layer 103. The first hole 701 exposes a sidewall 113S of the resistive switching film 113A, a sidewall of the mask layer 301 and a sidewall of the dielectric layer 103. A bottom 701B of the first hole 701 exposes the third dielectric layer 103. The second hole 702 extends along the second direction D2 and penetrates the mask layer 301 and the third dielectric layer 103. The second hole 702 exposes a sidewall 113S of the resistive switching film 113A, a sidewall of the mask layer 301 and a sidewall of the third dielectric layer 103. A bottom 702B of the second hole 702 exposes the third dielectric layer 103. The third hole 705 includes a third lower hole 703 and a third upper hole 704 above the third lower hole 703. The third lower hole 703 communicates with the third upper hole 704. The third lower hole 703 extends along the second direction D2 and penetrates the third dielectric layer 103 and the second dielectric layer 102. The third lower hole 703 exposes a sidewall of the third dielectric layer 103 and a sidewall of the second dielectric layer 102. A bottom 703B of the third lower hole 703 (or may be understood as a bottom of the third hole 705) exposes the second metal layer 122. In an embodiment, the third lower hole 703 may taper from the third dielectric layer 103 to an upper surface 122U of the second metal layer 122 along the second direction D2. The third upper hole 704 extends along the second direction D2 and penetrates the mask layer 301 and the third dielectric layer 103. The third upper hole 704 exposes a sidewall of the third dielectric layer 103 and a sidewall of the mask layer 301. In an embodiment, an etching process such as a wet etching process or a dry etching process can be performed to remove a portion of the resistive switching material film 501B, a portion of the mask layer 301 and a portion of the third dielectric layer 103 to form the first hole 701 and the second hole 702, and remove a portion of the mask layer 301, a portion of the third dielectric layer 103 and a portion of the second dielectric layer 102 to form the third hole 705. The first hole 701, the second hole 702 and the third hole 705 can be formed in the same etching process. At this time, a portion of the resistive switching material film 501B that is not removed (or a portion of the resistive switching material film 501B that is remained) can be defined as the resistive switching film 113A. In this step, removing the portion of the resistive switching material film 501B to form the resistive switching film 113A can reduce the size of element. The present disclosure is not limited thereto. In other embodiments, the step of forming the first hole 701 and the second hole 702 may not include removing a portion of the resistive switching material film 501B.

In FIG. 7, a height H7 of the first hole 701 in the second direction D2 and a height H8 of the second hole 702 in the second direction D2 are greater than a height H3 of the resistive switching film 113A in the second direction D2. The present disclosure is not limited thereto. In other embodiments, the height H7 of the first hole 701 in the second direction D2 can be equal to the height H3 of the resistive switching film 113A in the second direction D2. In FIG. 7, a bottom 701B of the first hole 701 and a bottom 702B of the second hole 702 are lower than a lower surface 113B of the resistive switching film 113A in the second direction D2. The present disclosure is not limited thereto. In other embodiments, the bottom 701B of the first hole 701 and the bottom 702B of the second hole 702 are coplanar with the lower surface 113B of the resistive switching film 113A in the second direction D2.

Referring to FIG. 8, a conductive material layer 801 is formed to fill the first hole 701, the second hole 702 and the third hole 705. In an embodiment, the conductive material layer 801 is formed on the upper surface 301U of the mask layer 301, on an upper surface 113U of the resistive switching film 113A, in the first hole 701, in the second hole 702 and in the third hole 705 by a deposition process such as a chemical vapor deposition process. The conductive material layer 801 may include a conductive material such as aluminum (Al), copper (Cu), tungsten (W), etc.

Figure 9:
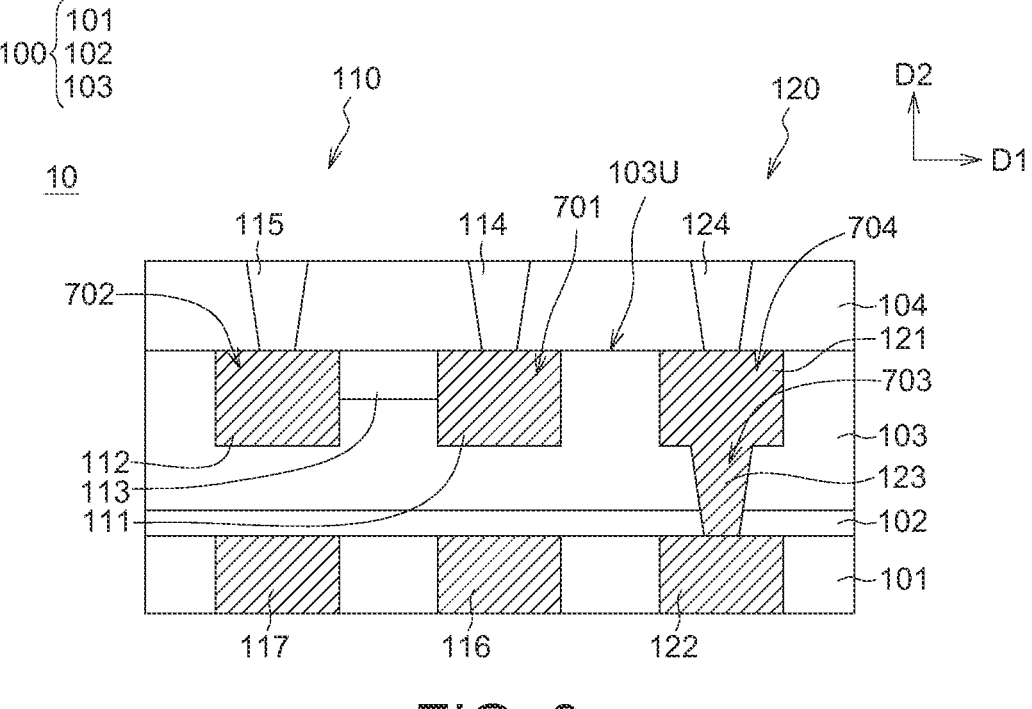

Referring to FIG. 9, a first electrode 111 and a second electrode 112 are formed on opposite sides of the resistive switching film 113. A first via 123 and a first metal layer 121 are formed on the second metal layer 122. In an embodiment, a portion of the conductive material layer 801 on an upper surface 103U of the third dielectric layer 103 is removed by a chemical-mechanical planarization process or other suitable etching process and a portion of the conductive material layer 801 below the upper surface 103U of the third dielectric layer 103 is remained. In the remained conductive material layer 801, a portion of the remained conductive material layer 801 in the first hole 701 can be defined as the first electrode 111, a portion of the remained conductive material layer 801 in the second hole 702 can be defined as the second electrode 112, a portion of the remained conductive material layer 801 in the third lower hole 703 can be defined as the first via 123, and a portion of the remained conductive material layer 801 in the third upper hole 704 can be defined as the first metal layer 121. During the removing of the portion of the conductive material layer 801 on the upper surface 103U of the third dielectric layer 103, the mask layer 301 and a portion of the resistive switching film 113A on the upper surface 103U of the third dielectric layer 103 are removed, and a portion of the resistive switching film 113A below the upper surface 103U of the third dielectric layer 103 are remained. The portion of the resistive switching film 113A below the upper surface 103U of the third dielectric layer 103 can be defined as the resistive switching film 113. In this embodiment, the resistive switching film 113 directly contacts the first electrode 111 and the second electrode 112. In other embodiments, the step of removing a portion of the conductive material layer 801 to form the first electrode 111, the second electrode 112, the first via 123 and the first metal layer 121 may not include removing the mask layer 301 (not shown); that is, a portion of the conductive material layer 801 on the upper surface of the mask layer 301 is removed, a portion of the conductive material layer 801 below the upper surface of the mask layer 301 is remained, and the mask layer 301 and the resistive switching film 113A as shown in FIG. 8 are remained; the resistive switching film 113A is the resistive switching film 113 in this case.

In an embodiment, after the first electrode 111, the second electrode 112, the first via 123 and the first metal layer 121 are formed, a fourth dielectric layer 104 is formed on the upper surface 103U of the third dielectric layer 103 (for example, fourth dielectric layer 104 may be formed by a deposition process such as a chemical vapor deposition process). Then, a second via 114, a third via 115 and a fourth via 124 are formed in the fourth dielectric layer 104. The second via 114, the third via 115 and the fourth via 124 may include the same or different materials. The second via 114, the third via 115 and the fourth via 124 may include conductive materials such as aluminum (Al), copper (Cu), tungsten (W), etc. The present disclosure is not limited thereto. The fourth dielectric layer 104 may include a dielectric material such as silicon oxide ($SiO_2$), undoped silicate glass (USG), fluorinated silicate glass (FSG), silicon nitride (SiN), silicon oxynitride (SiON), silicon nitricarbide (SiCN), etc.

In an embodiment, a semiconductor device 10 shown in FIG. 1 is provided through the method schematically illustrated in FIGS. 3-9.

FIGS. 10-17 illustrate a method for manufacturing a semiconductor device according to another embodiment of the present disclosure.

Figure 10:
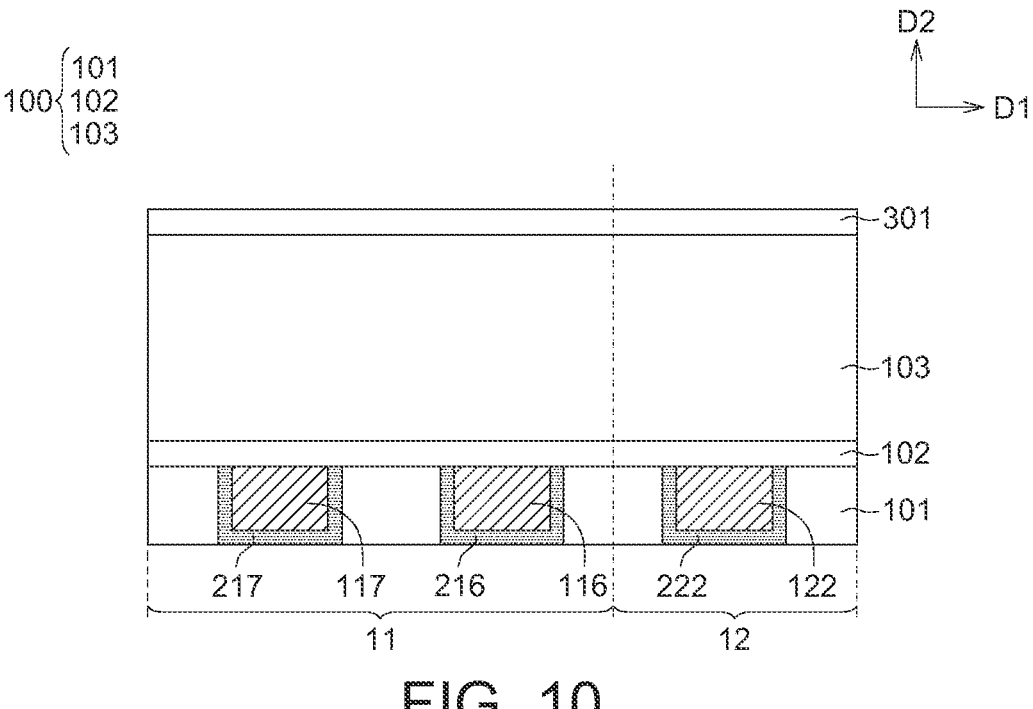
FIGS. 10-17 illustrate a method for manufacturing a semiconductor device according to another embodiment of the present disclosure.
Figure 11:
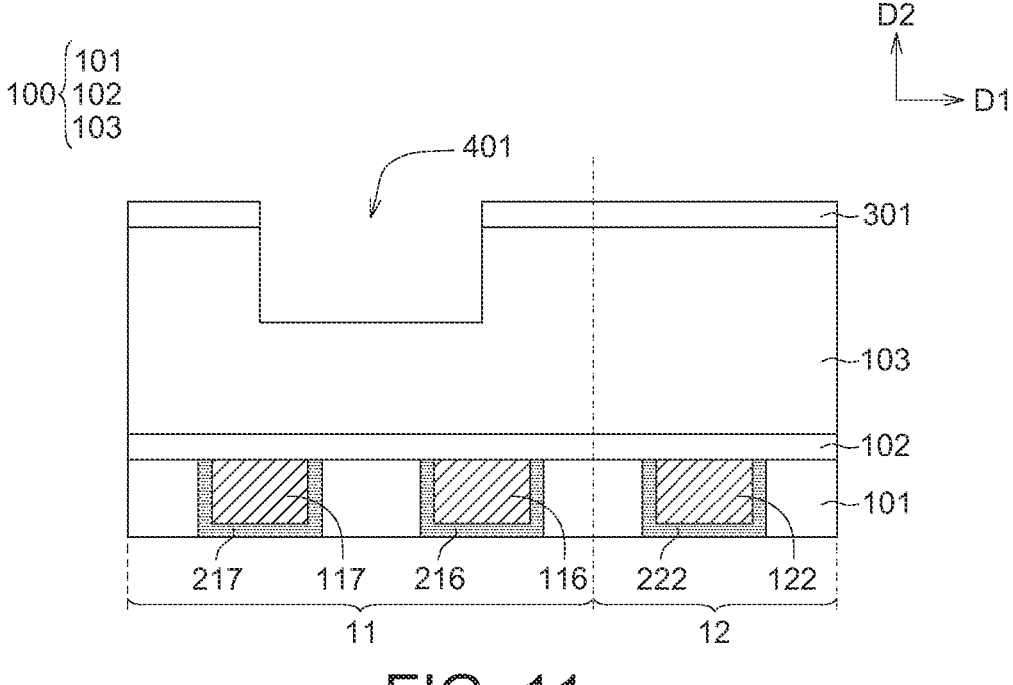
Figure 12:
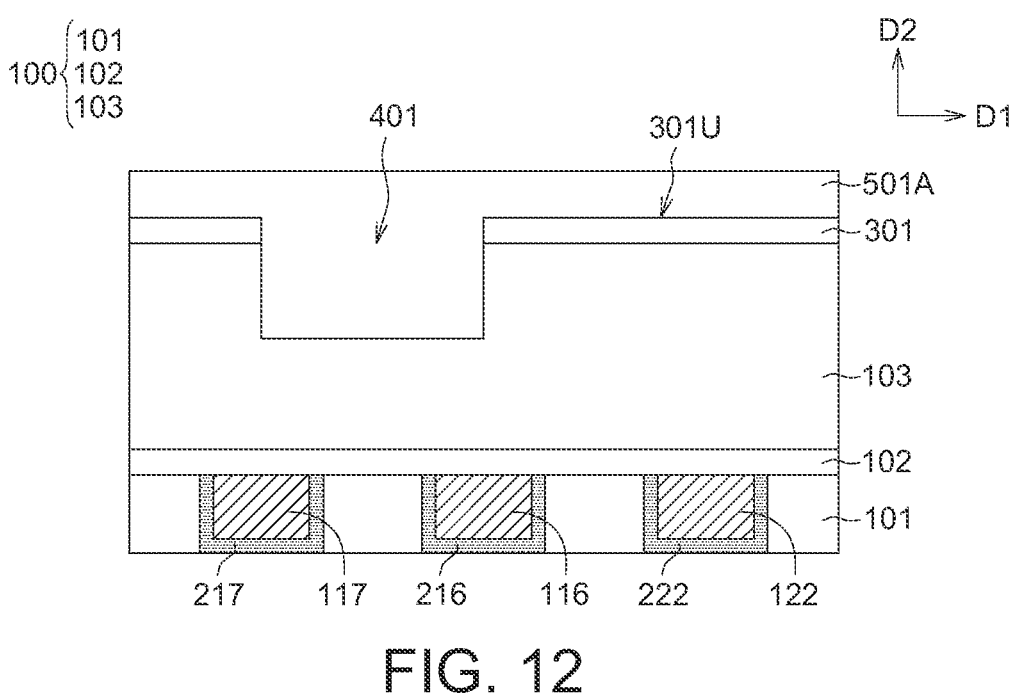
Figure 13:
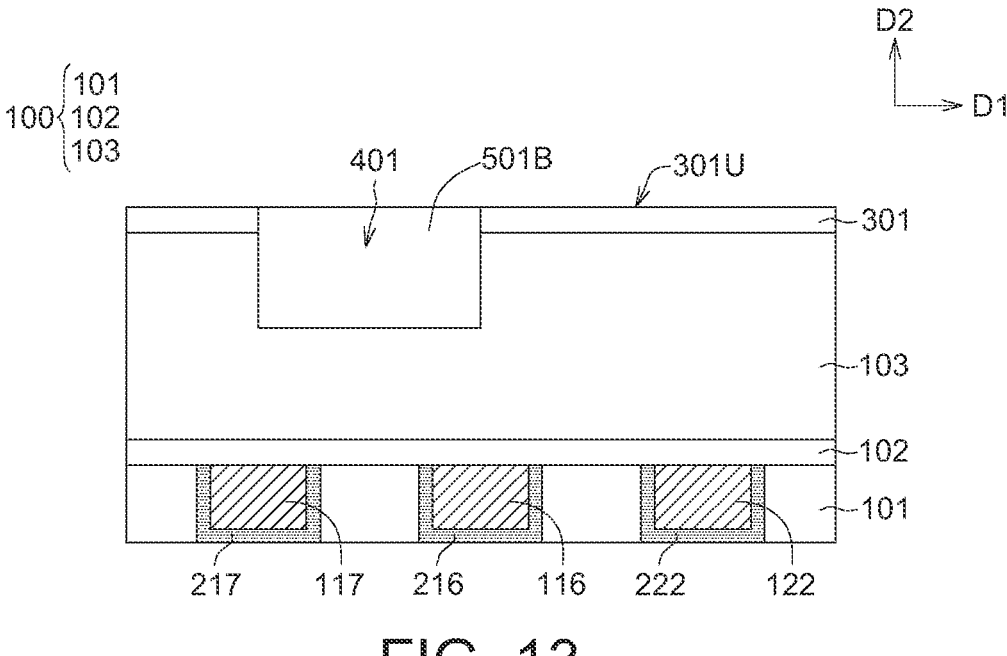

Referring to FIG. 10, a substrate 100 is provided. A third barrier film 216, a fourth barrier film 217, a sixth barrier film 222, a second metal layer 122, a third metal layer 116 and a fourth metal layer 117 may be formed in the substrate 100. A mask layer 301 may be formed on the substrate 100. The substrate 100 may be a semiconductor substrate in a certain process stage, such as a semiconductor substrate that a front-end-of-line process (FEOL) and part of a back-end-of-line process (BEOL) have been completed or other semiconductor substrate that a resistance random access memory can be fabricated on the front or back of the substrate. In an embodiment, the third barrier film 216, the fourth barrier film 217, the sixth barrier film 222 can be formed in a first dielectric layer 101, and then the third metal layer 116, the fourth metal layer 117 and the second metal layer 122 can be formed on the third barrier film 216, the fourth barrier film 217, the sixth barrier film 222 respectively. Next, a second dielectric layer 102, a third dielectric layer 103 and a mask layer 301 are formed sequentially on the first dielectric layer 101 along the second direction D2 to form the structure shown in FIG. 10. The third barrier film 216, the fourth barrier film 217, the sixth barrier film 222 may include the same or different materials. The third barrier film 216, the fourth barrier film 217, the sixth barrier film 222 may include, but is not limited to, titanium (Ti), tantalum (Ta), titanium nitride (TiN), tantalum nitride (TaN) or a combination of the above materials. A portion of the substrate 100 can be defined as a memory region 11, and another portion of the substrate 100 can be defined as a logic region 12. The third barrier film 216, the fourth barrier film 217, the third metal layer 116 and the fourth metal layer 117 may be in the memory region 11 of the substrate 100. The sixth barrier film 222 and the second metal layer 122 may be in the logic region 12 of the substrate 100.

Referring to FIGS. 11-14, the steps shown in FIGS. 11-14 are similar to the steps shown in FIGS. 4-7. The steps shown in FIGS. 11-14 can be performed with reference to the above descriptions related to FIGS. 4-7.

Figures 14, 15:
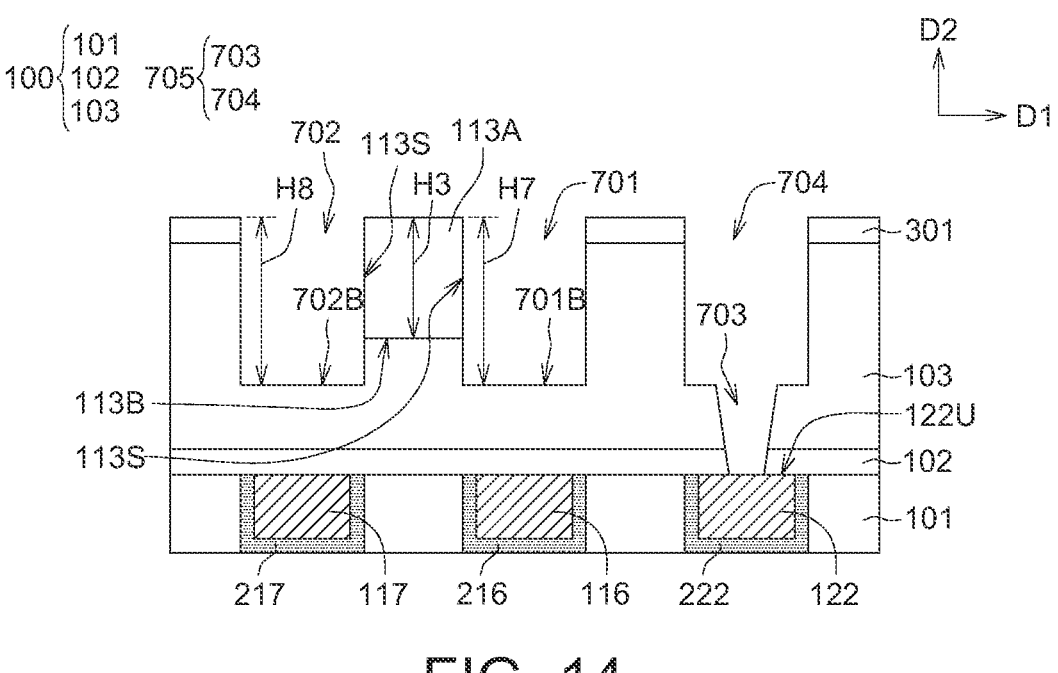

Referring to FIG. 15, a barrier material film 1501 is formed on the mask layer 301, and formed along the sidewalls and bottoms of the first hole 701, the second hole 702 and the third hole 705 without filling the first hole 701, the second hole 702 and the third hole 705. The barrier material film 1501 may directly contact the third dielectric layer 103, the mask layer 301, the resistive switching film 113A, the second dielectric layer 102 and the second metal layer 122. In an embodiment, the barrier material film 1501 is formed on the upper surface 301U of the mask layer 301, the upper surface 113U of the resistive switching film 113A, a sidewall of the first hole 701, a sidewall of the second hole 702 and a sidewall of the third hole 705 by a deposition process such as a chemical vapor deposition process. The barrier material film 1501 may include, but is not limited to, titanium (Ti), tantalum (Ta), titanium nitride (TiN), tantalum nitride (TaN) or a combination of the above materials.

Figure 16:
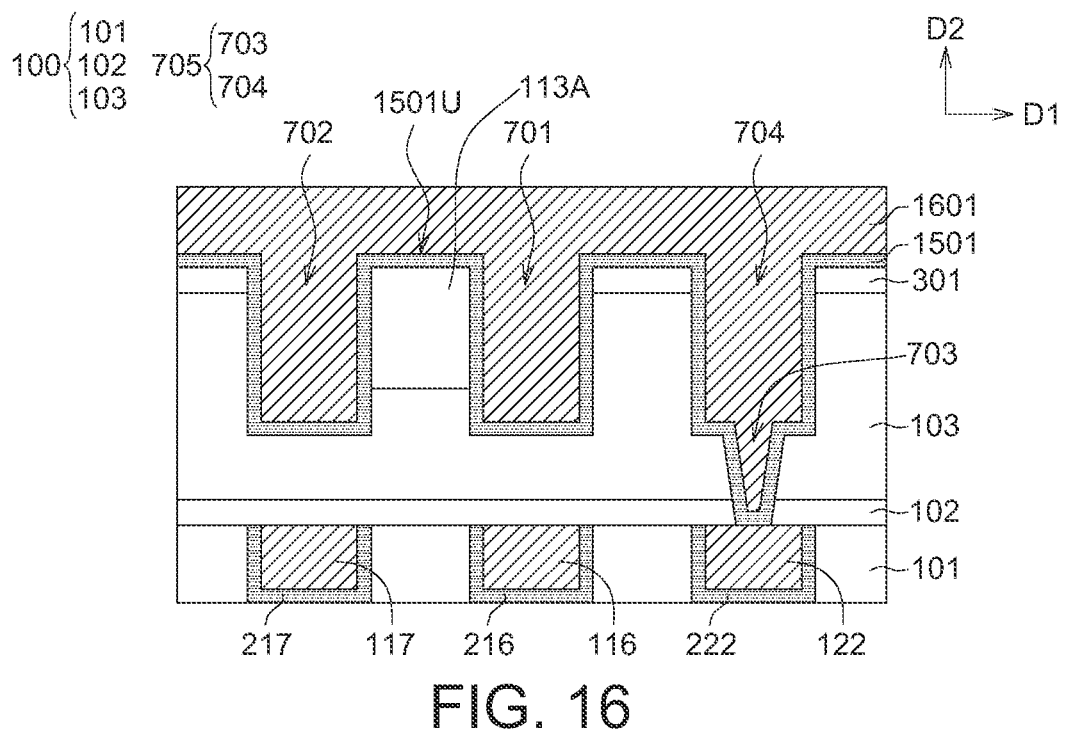

Referring to FIG. 16, a conductive material layer 1601 is formed to fill the remaining spaces of the first hole 701, the second hole 702 and the third hole 705. In an embodiment, the conductive material layer 1601 is formed on an upper surface 1501U of the barrier material film 1501 by a deposition process such as a chemical vapor deposition process. The conductive material layer 1601 is formed in the first hole 701, the second hole 702 and the third hole 705. The conductive material layer 1601 may include a conductive material such as aluminum (Al), copper (Cu), tungsten (W), etc.

Figure 17:
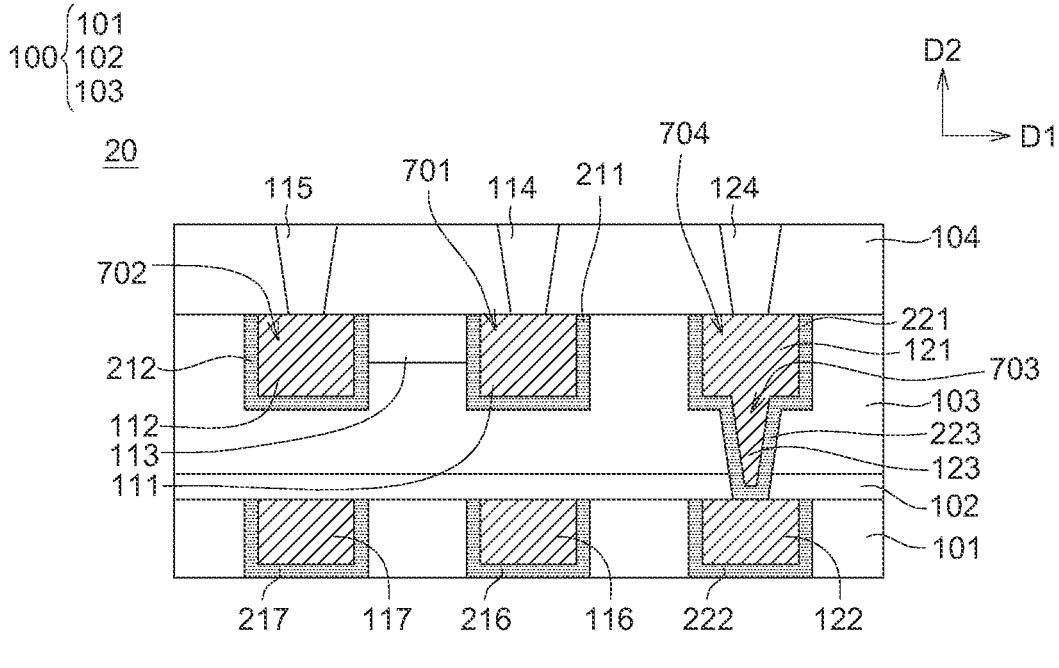

Referring to FIG. 17, the first electrode 111 and the second electrode 112 are formed on opposite sides of the resistive switching film 113. A first via 123 and a first metal layer 121 are formed on the second metal layer 122. In the step shown in FIG. 17, a first barrier film 211 is formed between the resistive switching film 113 and the first electrode 111, a second barrier film 212 is formed between the resistive switching film 113 and the second electrode 112, and a fifth barrier film 221 is formed between the first metal layer 121 and the third dielectric layer 103. A portion of a seventh barrier film 223 is formed between the first via 123 and the third dielectric layer 103, and another portion of a seventh barrier film 223 is formed between the first via 123 and the second dielectric layer 102. In an embodiment, a portion of the conductive material layer 1601 above the upper surface of the third dielectric layer 103 and a portion of the barrier material film 1501 above the upper surface of the third dielectric layer 103 are removed by a chemical-mechanical planarization process or other suitable etching process, and a portion of the conductive material layer 1601 below the upper surface of the third dielectric layer 103 and a portion of the barrier material film 1501 below the upper surface of the third dielectric layer 103 are remained. In the remained barrier material film 1501, a portion of the remained barrier material film 1501 in the first hole 701 can be defined as the first barrier film 211, a portion of the remained barrier material film 1501 in the second hole 702 can be defined as the second barrier film 212, a portion of the remained barrier material film 1501 in the third lower hole 703 can be defined as the seventh barrier film 223, and a portion of the remained barrier material film 1501 in the third upper hole 704 can be defined as the fifth barrier film 221. In the remained conductive material layer 1601, a portion of the remained conductive material layer 1601 in the first hole 701 can be defined as the first electrode 111, a portion of the remained conductive material layer 1601 in the second hole 702 can be defined as the second electrode 112, a portion of the remained conductive material layer 1601 in the third lower hole 703 can be defined as the first via 123, and a portion of the remained conductive material layer 1601 in the third upper hole 704 can be defined as the first metal layer 121. During the removing of the portion of the conductive material layer 1601 above the upper surface of the third dielectric layer 103 and the portion of the barrier material film 1501 above the upper surface of the third dielectric layer 103, the mask layer 301 and a portion of the resistive switching film 113A above the upper surface of the third dielectric layer 103 are removed, and a portion of the resistive switching film 113A in the third dielectric layer 103 are remained. The portion of the resistive switching film 113A in the third dielectric layer 103 can be defined as the resistive switching film 113. In this embodiment, the resistive switching film 113 directly contacts the first barrier film 211 and the second barrier film 212. In other embodiments, the step of removing a portion of the conductive material layer 1601 to form the first electrode 111, the second electrode 112, the first via 123 and the first metal layer 121 may not include removing the mask layer 301 (not shown); that is, a portion of the conductive material layer 1601 above the upper surface of the mask layer 301 and a portion of the barrier material film 1501 above the upper surface of the mask layer 301 are removed, a portion of the conductive material layer 1601 below the upper surface of the mask layer 301 and a portion of the barrier material film 1501 below the upper surface of the mask layer 301 are remained, and the mask layer 301 and the resistive switching film 113A as shown in FIG. 16 are remained; the resistive switching film 113A is the resistive switching film 113 in this case.

In an embodiment, after the first electrode 111, the second electrode 112, the first metal layer 121, the first barrier film 211, the second barrier film 212, the fifth barrier film 221 and the seventh barrier film 223 are formed, a fourth dielectric layer 104 is formed on the upper surface of the third dielectric layer 103 (for example, the fourth dielectric layer 104 may be formed by a deposition process such as a chemical vapor deposition process). Then, a second via 114, a third via 115 and a fourth via 124 are formed in the fourth dielectric layer 104. In other embodiments, a barrier film may be formed between the second via 114 and the fourth dielectric layer 104, and/or a barrier film may be formed between the third via 115 and the fourth dielectric layer 104, and/or a barrier film may be formed between the fourth via 124 and the fourth dielectric layer 104.

In an embodiment, a semiconductor device 20 shown in FIG. 2 is provided through the method schematically illustrated in FIGS. 10-17.

The semiconductor devices and methods for manufacturing the same according to the present disclosure have at least the following benefits. The resistance random access memory in the semiconductor device according to the present disclosure is a lateral type resistance random access memory. Compared with a vertical type resistance random access memory, the number of via for the lateral type resistance random access memory can be reduced, and the manufacturing method for the lateral type resistance random access memory is simple and the cost is low. The space utilization of the semiconductor device can be improved. The critical dimension (i.e. the height of the resistive switching film in the second direction D2) of the resistance random access memory in the semiconductor device according to the present disclosure can be adjusted as needed without being limited by the process steps for the logic region. Thus, a resistance random access memory with a smaller critical dimension and faster operation speed can be formed. In addition, the electrodes in the memory region of the semiconductor device and the conductive connection elements (e.g. the first via and the first metal layer) in the logic region of the semiconductor device can be formed at the same time in the same manufacturing process without using additional materials and processes to separately form the electrodes in the memory region and the conductive connection elements in the logic region, and therefore, the method according to the present disclosure is simple and the production cost can be reduced.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a semiconductor device, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
a first semiconductor structure and a second semiconductor structure disposed on one side of the first semiconductor structure along a first direction,
wherein the first semiconductor structure comprises:
a first electrode,
a second electrode on one side of the first electrode, and
a resistive switching film between the first electrode and the second electrode, wherein the first electrode, the resistive switching film and the second electrode are arranged along the first direction,
wherein the second semiconductor structure comprises:
a first via;
a first metal layer on the first via along a second direction and electrically connected to the first via, wherein the first direction is perpendicular to the second direction; and
a second metal layer below the first via and electrically connected to the first via,
wherein an upper surface of the first electrode, an upper surface of the resistive switching film, an upper surface of the second electrode, and an upper surface of the first metal layer are coplanar.

2. The semiconductor device according to claim 1, wherein the first semiconductor structure comprises a second via and a third via, the second via is on the upper surface of the first electrode, the third via is on the upper surface of the second electrode, and wherein the second via, the second semiconductor structure and the third via are electrically connected to each other.

3. The semiconductor device according to claim 1, wherein the first semiconductor structure is in a memory region and the second semiconductor structure is in a logic region.

4. The semiconductor device according to claim 1, wherein the resistive switching film directly contacts the first electrode and the second electrode.

5. The semiconductor device according to claim 1, wherein the first semiconductor structure comprises a first barrier film between the first electrode and the resistive switching film and a second barrier film between the second electrode and the resistive switching film.

6. The semiconductor device according to claim 1, wherein a lower surface of the first electrode and a lower surface of the resistive switching film are coplanar.

7. The semiconductor device according to claim 1, wherein a height of the first electrode is greater than a height of the resistive switching film.

8. The semiconductor device according to claim 1, further comprising:
a first dielectric layer;
a second dielectric layer; and
a third dielectric layer, wherein the first dielectric layer, the second dielectric layer and the third dielectric layer are stacked along the second direction,
wherein the first electrode, the resistive switching film and the second electrode are in the third dielectric layer and above the second dielectric layer.

9. The semiconductor device according to claim 8, wherein the first via is in the second dielectric layer and the third dielectric layer, and the first metal layer is in the third dielectric layer and above the second dielectric layer.

10. The semiconductor device according to claim 9, wherein the second metal layer is in the first dielectric layer.

11. The semiconductor device according to claim 10, wherein the first semiconductor structure comprises a third metal layer and a fourth metal layer in the first dielectric layer, wherein the third metal layer at least partially overlaps the first electrode in the second direction, and the fourth metal layer at least partially overlaps the second electrode in the second direction.

12. The semiconductor device according to claim 11, wherein the first semiconductor structure is in a memory region and the second semiconductor structure is in a logic region.

13. The semiconductor device according to claim 1, wherein the second semiconductor structure comprises a barrier film on an outer surface of the first metal layer.

14. The semiconductor device according to claim 13, wherein the second semiconductor structure comprises another barrier film on an outer surface of the second metal layer.

15. The semiconductor device according to claim 14, wherein the second semiconductor structure comprises a barrier film on an outer surface of the first metal layer.

* * * * *